(12) United States Patent
Dai et al.

(10) Patent No.: US 11,791,431 B2
(45) Date of Patent: Oct. 17, 2023

(54) BACK CONTACT SOLAR CELL STRING AND PREPARATION METHOD THEREFOR, MODULE, AND SYSTEM

(71) Applicants: Zhejiang Aiko Solar Energy Technology Co., Ltd., Jinhua (CN); Guangdong Aiko Solar Energy Technology Co., Ltd., Foshan (CN); Tianjin Aiko Solar Energy Technology Co., Ltd., Tianjin (CN)

(72) Inventors: Wei Dai, Jinhua (CN); Gang Chen, Jinhua (CN)

(73) Assignees: ZHEJIANG AIKO SOLAR ENERGY TECHNOLOGY CO., LTD., Jinhua (CN); GUANGDONG AIKO SOLAR ENERGY TECHNOLOGY CO., LTD., Foshan (CN); TIANJIN AIKO SOLAR ENERGY TECHNOLOGY CO., LTD., Tianjin (CN)

(*) Notice: Subject to any disclaimer, the term of this patent is extended or adjusted under 35 U.S.C. 154(b) by 0 days.

(21) Appl. No.: 17/951,076

(22) Filed: Sep. 22, 2022

(65) Prior Publication Data

US 2023/0020825 A1  Jan. 19, 2023

Related U.S. Application Data

(63) Continuation-in-part of application No. 17/527,135, filed on Nov. 15, 2021, now Pat. No. 11,482,632.

(30) Foreign Application Priority Data

May 28, 2021  (CN) .......................... 202110592349.9

(51) Int. Cl.
     *H01L 31/05*     (2014.01)

(52) U.S. Cl.
     CPC ...... *H01L 31/0516* (2013.01); *H01L 31/0512* (2013.01)

(58) Field of Classification Search
     CPC .................................................. H01L 31/0516
     See application file for complete search history.

(56) References Cited

U.S. PATENT DOCUMENTS

2017/0104114 A1* 4/2017 Kim .................... H01L 31/0745

FOREIGN PATENT DOCUMENTS

| CN | 104064609 A | 9/2014 |
|----|-------------|--------|
| CN | 104810423 A | 7/2015 |
| EP | 2958152 A1  | 12/2015 |

* cited by examiner

*Primary Examiner* — Tae-Sik Kang
(74) *Attorney, Agent, or Firm* — MATTHIAS SCHOLL P.C.; Matthias Scholl

(57) ABSTRACT

A back contact solar cell string includes at least two cell pieces, each cell piece including P-type doped regions and N-type doped regions that are alternately arranged, the P-type doped regions including positive electrode thin grid lines, and the N-type doped regions including negative electrode thin grid lines; and a plurality of conductive wires connected to the positive electrode thin grid lines and the negative electrode thin grid lines. The conductive regions configured for electrical connection between each conductive wire and the positive electrode thin grid lines or the negative electrode thin grid lines and insulation regions configured for insulating connection between each conductive wire and the negative electrode thin grid lines or the positive electrode thin grid lines are alternately disposed at joints between each conductive wire and the positive electrode thin grid lines, and at joints between each conductive wire and the negative electrode thin grid lines.

5 Claims, 5 Drawing Sheets

BACK CONTACT SOLAR CELL STRING AND PREPARATION METHOD THEREFOR, MODULE, AND SYSTEM

CROSS-REFERENCE TO RELATED APPLICATIONS

This application is a continuation-in-part of U.S. application Ser. No. 17/527,135 filed Nov. 15, 2021, and claims the benefit of Chinese Patent Application No. 202110592349.9 filed May 28, 2021. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, MA 02142.

BACKGROUND

The disclosure relates to the technical field of solar cells, and in particular, to a back contact solar cell string and a preparation method therefor, a module, and a system.

A solar cell is a semiconductor device capable of converting light energy to electric energy. The solar cell industry pursues low production costs and high energy conversion efficiency of solar cells. For a conventional solar cell, the contact electrode of an emitter and the contact electrode of a base are respectively located on two opposite sides of a cell piece. The front side of the cell is a light-receiving surface. When the front metal contact electrode of an emitter is covered, part of incident sunlight is reflected and shielded by the metal electrode, resulting in optical loss. The front metal electrode of a common crystalline silicon solar cell is covered by about 7% in area. The energy conversion efficiency of the cell may be directly enhanced by reducing the covering of the front metal electrode. A back contact solar cell is a cell in which the contact electrodes of an emitter and a base are both disposed on the back side (a non-light-receiving surface) of the cell. The front surface without a metal electrode of back contact cells increases the light-receiving area, effectively increasing the short-circuit current of a cell piece. In addition, a relatively wide metal grid line is allowed on the back side of back contact cells to reduce the serial resistance, thereby increasing the fill factor. The cell without front shielding not only has high conversion efficiency, but also has a more pleasing appearance. In addition, a module having electrodes disposed on a back side is easy to assemble.

Conventional back contact cells are serially connected to form a cell string, which then undergoes other manufacturing processes to form a module. A serial connection technology therefor is to weld each busbar (N-type busbar and P-type busbar) to the ribbons on the edges of the cell piece. Then, a front electrode (a negative electrode) ribbon of a cell piece is welded to a back electrode (a positive electrode) ribbon of an adjacent cell piece, and leads are welded at a positive electrode and a negative electrode of the cell string formed through serial connection, so as to achieve connection between the cell pieces. However, the interval between adjacent ribbons on the cell pieces reduces the total efficiency of the solar cell. In addition, a large amount of silver paste is required for the preparation of busbar. Therefore, high process costs are required for forming the busbar and the ribbons on the cell pieces. In addition, the circuitous route of the ribbons from a back side of a cell piece to a front side of another cell piece may lead to manufacturing problems including the difficulty in cell alignment. Moreover, warping of the cell pieces is easily caused by stresses resulting from single-side welding of the cell pieces.

SUMMARY

The technical problem to be resolved in the disclosure is to provide a back contact solar cell string, so as to resolve problems including the high costs as a result of large consumption of paste of conventional cell pieces and the difficulty in manufacturing as a result of circuitous connection among front and back sides of the cell pieces.

In order to resolve the above technical problems, the disclosure provides a back contact solar cell string. The back contact solar cell string comprises:

at least two cell pieces, each cell piece comprising P-type doped regions and N-type doped regions that are alternately arranged, the P-type doped regions comprising positive electrode thin grid lines, and the N-type doped regions comprising negative electrode thin grid lines; and a plurality of conductive wires connected to the positive electrode thin grid lines and the negative electrode thin grid lines.

Conductive regions configured for electrical connection between each conductive wire and the positive electrode thin grid lines or the negative electrode thin grid lines and insulation regions configured for insulating connection between the each conductive wire and the negative electrode thin grid lines or the positive electrode thin grid lines are alternately disposed at joints between the each conductive wire and the positive electrode thin grid lines, and at joints between the each conductive wire and the negative electrode thin grid lines.

The conductive wires are regularly cut off between two adjacent cell pieces.

In a class of this embodiment, the conductive wires comprise first conductive wires and second conductive wires; the first conductive wires are electrically connected to the positive electrode thin grid lines on one of the cell pieces and the negative electrode thin grid lines on an adjacent cell piece of the one cell piece in the conductive regions, and are in insulating connection to the negative electrode thin grid lines on one of the cell pieces and the positive electrode thin grid lines on an adjacent cell piece of the one cell piece in the insulation regions.

The second conductive wires are electrically connected to the negative electrode thin grid lines on one of the cell pieces and the positive electrode thin grid lines on an adjacent cell piece of the one cell piece in the conductive regions, and are in insulating connection to the positive electrode thin grid lines on one of the cell pieces and the negative electrode thin grid lines on an adjacent cell piece of the one cell piece in the insulation regions.

In a class of this embodiment, the conductive wires comprise metal wires and composite films wrapped around part of the metal wires.

In a class of this embodiment, the conductive wires are metal wires.

In a class of this embodiment, conductive adhesives, solder pastes, or conductive tapes are disposed in the conductive regions, or the conductive wires come into direct contact with the positive electrode thin grid lines or the negative electrode thin grid lines in the conductive regions to form electrical connection.

In a class of this embodiment, the composite films are a polyolefin elastomer (POE) film, an ethylene vinyl acetate copolymer (EVA) film, a polyvinyl butyral (PVB) film or the POE/EVA co-extruded film.

In a class of this embodiment, the positive electrode thin grid lines or the negative electrode thin grid lines are aluminum grid lines, silver grid lines, copper grid lines, or silver-coated copper grid lines.

In a class of this embodiment, the positive electrode thin grid lines comprise aluminum grid lines and silver grid lines alternately disposed with each other, and the silver grid lines are connected to the conductive regions.

In a class of this embodiment, insulators are disposed in the insulation regions.

In a class of this embodiment, at least one first conductive wire and a corresponding equal quantity of second conductive wires are alternately disposed.

In a class of this embodiment, a first conductive wire and a second conductive wire are alternately disposed, or two first conductive wires and two second conductive wires are alternately disposed.

In a class of this embodiment, a same quantity of conductive wires is cut off between two adjacent cell pieces at an interval of a first preset quantity of conductive wires.

In a class of this embodiment, the first preset quantity is in a range of 1-4.

In a class of this embodiment, the cell string further comprises conductive bus bars located on end portions of the solar cell string. A same quantity of conductive wires is electrically connected to the conductive bus bars at an interval of a second preset quantity of conductive wires.

In a class of this embodiment, the second preset quantity is in a range of 1-4.

Correspondingly, the disclosure further provides a cell module. The cell module comprises the back contact solar cell string described above.

Correspondingly, the disclosure further provides a photovoltaic system. The photovoltaic system comprises the cell module described above.

Correspondingly, the disclosure further provides a method for preparing a back contact solar cell string. The method comprises:

respectively arranging an insulator and an electric conductor in an insulation region and a conductive region on each positive electrode thin grid line and each negative electrode thin grid line of each cell piece that are correspondingly connected to conductive wires;

successively attaching the conductive wires to the insulators or the electric conductors arranged on the positive electrode thin grid lines and the negative electrode thin grid lines of each cell piece; and regularly cutting off the conductive wires between two adjacent cell pieces.

In a class of this embodiment, the conductive wires comprise metal wires and composite films wrapped around part of the metal wires.

After successively attaching the conductive wires to the positive electrode thin grid lines and the negative electrode thin grid lines of each cell piece, or after regularly cutting off the conductive wires between the two adjacent cell pieces, the method further comprises:

pre-bonding the conductive wires to the cell pieces by means of low temperature heating.

In a class of this embodiment, the method further comprises:

connecting the conductive wires to the positive electrode thin grid lines and the negative electrode thin grid lines of the cell pieces by means of lamination and heating.

In a class of this embodiment, successively attaching the conductive wires to the insulators or the electric conductors arranged on the positive electrode thin grid lines and the negative electrode thin grid lines of each cell piece comprises:

alternately attaching a third preset quantity of first conductive wires and a third preset quantity of second conductive wires to the insulators or the electric conductors arranged on the positive electrode thin grid lines and the negative electrode thin grid lines of each cell piece.

The first conductive wires are attached to the electric conductors alternately disposed on the positive electrode thin grid lines in the cell piece, the insulators alternately disposed on the negative electrode thin grid lines in the cell piece, the electric conductors alternately disposed on the negative electrode thin grid lines in the adjacent cell piece, and the insulators alternately disposed on the positive electrode thin grid lines in the adjacent cell piece.

The second conductive wires are attached to the electric conductors alternately disposed on the positive electrode thin grid lines in the cell piece, the insulators alternately disposed on the negative electrode thin grid lines in the cell piece, the electric conductors alternately disposed on the negative electrode thin grid lines in the adjacent cell piece, and the insulators alternately disposed on the positive electrode thin grid lines in the adjacent cell piece.

In a class of this embodiment, the positive electrode thin grid lines comprise aluminum grid lines and silver grid lines alternately disposed with each other, and the silver grid lines are connected to the conductive regions.

In a class of this embodiment, the method further comprises:

regularly electrically connecting the conductive wires on the cell pieces at an end portion to conductive bus bars;

or electrically connecting each conductive wire on the cell pieces at the end portion to conductive bus bars; and regularly cutting off the conductive wires between the cell pieces and the conductive bus bars.

The disclosure has the following beneficial effects:

The current of each cell piece is collected without busbar and ribbon. Instead, a positive electrode thin grid line or a negative electrode thin grid line on each cell piece is directly connected to a corresponding negative electrode thin grid line or positive electrode thin grid line on a next adjacent cell piece by using a plurality of continuous conductive wires, and the conductive wires between the two cell pieces are regularly cut off, so as to achieve serial connection among the cell pieces. In this way, the consumption of the silver paste of the busbar is reduced, and the production costs are reduced. In addition, since the conductive wires are all disposed on the back sides of all of the cell pieces and are directly connected to the positive electrode thin grid lines or the negative electrode thin grid lines, conventional operations having difficulty in cell alignment such as circuitous connection from a back side of one cell piece to a front side of a next cell piece are avoided. Thus, the problems such as the high costs as a result of large consumption of paste of conventional cell pieces and the difficulty in manufacturing as a result of circuitous connection among front and back sides of the cell pieces are resolved. In an embodiment, two first conductive wires and two second conductive wires are alternately disposed, and two second conductive wires are cut off at an interval of two first conductive wires between two adjacent cell pieces. Therefore, the carrier collection is more effective and the loss of the silver paste is further reduced.

DETAILED DESCRIPTION

To make the objectives, technical solutions and advantages of the disclosure clearer and more comprehensible, the disclosure is further described in detail below with reference to the accompanying drawings and embodiments. It is to be understood that the specific embodiments described herein are merely used to explain the disclosure, but are not intended to limit the disclosure.

In the disclosure, unless otherwise explicitly specified or defined, the terms such as "mount", "install", "connect", "connection", and "fix" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand specific meanings of the foregoing terms in the disclosure according to specific situations. The term "and/or" used in this specification comprises any and all combinations of one or more related listed items.

According to the disclosure, no busbar and ribbon are disposed to collect the current of each cell piece. Instead, a positive electrode thin grid line or a negative electrode thin grid line on each cell piece is directly connected to a corresponding negative electrode thin grid line or positive electrode thin grid line on a next adjacent cell piece by using a plurality of continuous conductive wires, and the conductive wires between the two cell pieces are regularly cut off, so as to achieve serial connection among the cell pieces. In this way, the consumption of silver paste of the busbar is reduced, and the production costs are reduced. In addition, since the conductive wires are all disposed on back sides of all of the cell pieces and are directly connected to the positive electrode thin grid lines or the negative electrode thin grid lines, conventional operations having difficulty in cell alignment such as circuitous connection from a back side of one cell piece to a front side of a next cell piece are avoided. Thus, the problems such as the high costs as a result of large consumption of paste of conventional cell pieces and the difficulty in manufacturing as a result of circuitous connection among front and back sides of the cell pieces are resolved.

Example 1

Figure 1:
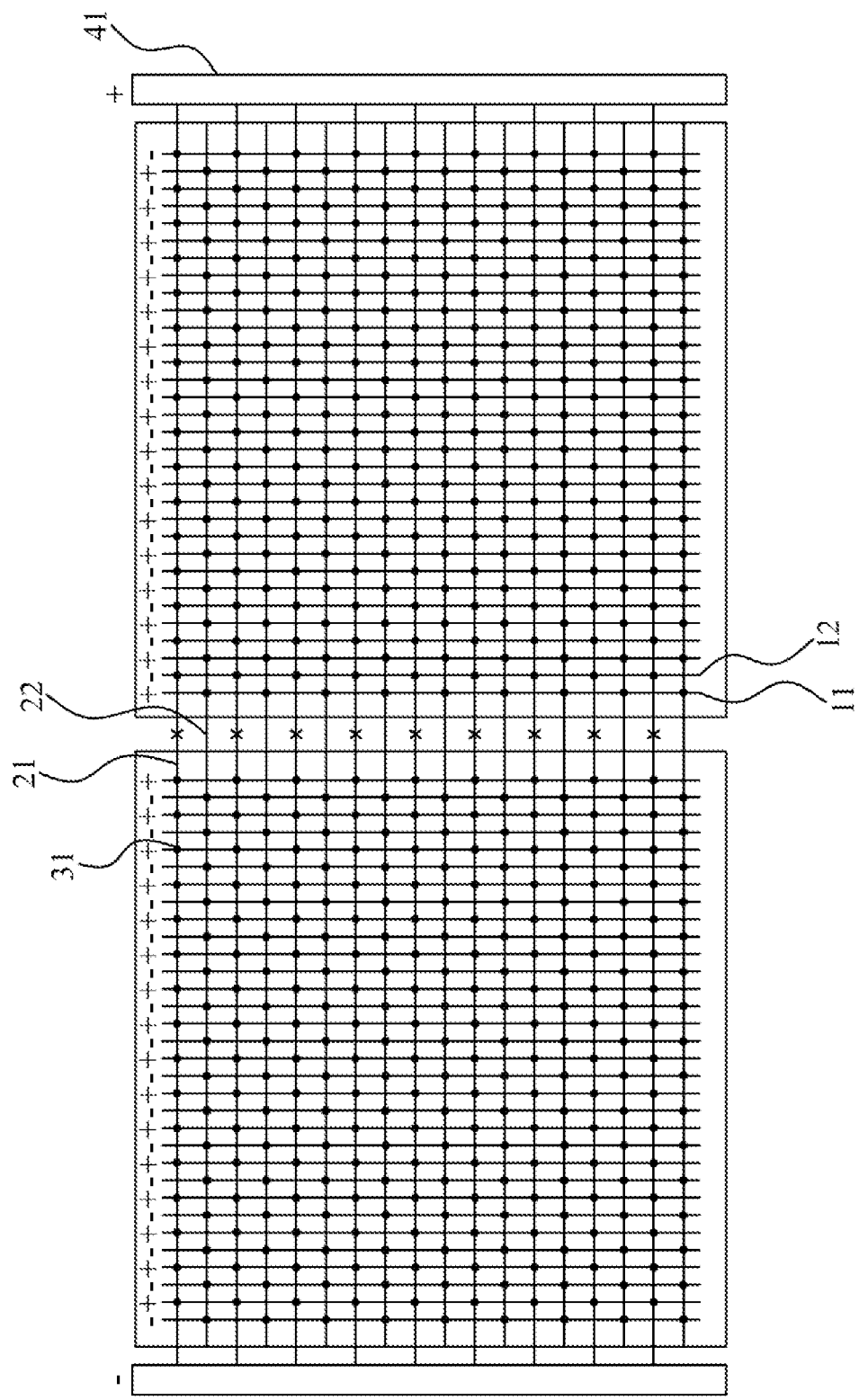
FIG. 1 is a schematic structural diagram of a back contact solar cell string according to an embodiment of the disclosure.

FIG. 1 is a schematic structural diagram of a back contact solar cell string according to an embodiment of the disclosure. For ease of description, only parts related to this embodiment of the disclosure are shown. The back contact solar cell string provided in this embodiment of the disclosure comprises:

at least two cell pieces, where each cell piece comprises P-type doped regions and N-type doped regions that are alternately arranged, positive electrode thin grid lines 11 are disposed in the P-type doped region, and negative electrode thin grid lines 12 are disposed in the N-type doped region; and a plurality of conductive wires connected to the positive electrode thin grid lines 11 and the negative electrode thin grid lines 12.

Conductive regions configured for electrical connection between the conductive wire and the positive electrode thin grid lines 11 or the negative electrode thin grid lines 12 and insulation regions configured for insulating connection between the conductive wire and the negative electrode thin grid lines 12 or the positive electrode thin grid lines 11 are alternately disposed at joints between each conductive wire and the positive electrode thin grid lines 11 and the negative electrode thin grid lines 12.

The conductive wires are regularly cut off between two adjacent cell pieces.

Figure 2:
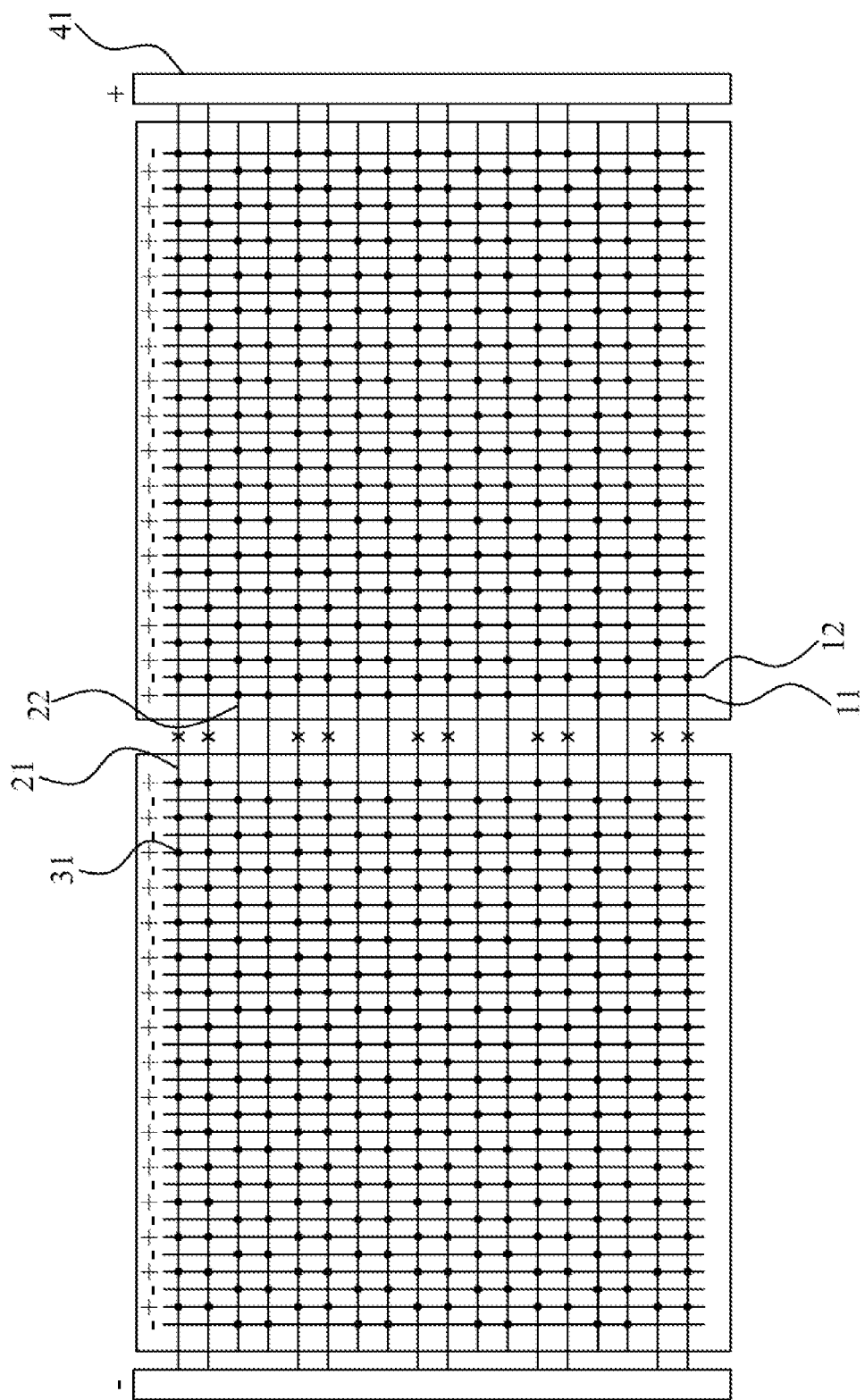
FIG. 2 is a schematic structural diagram of a back contact solar cell string according to another embodiment of the disclosure.
Figure 3:
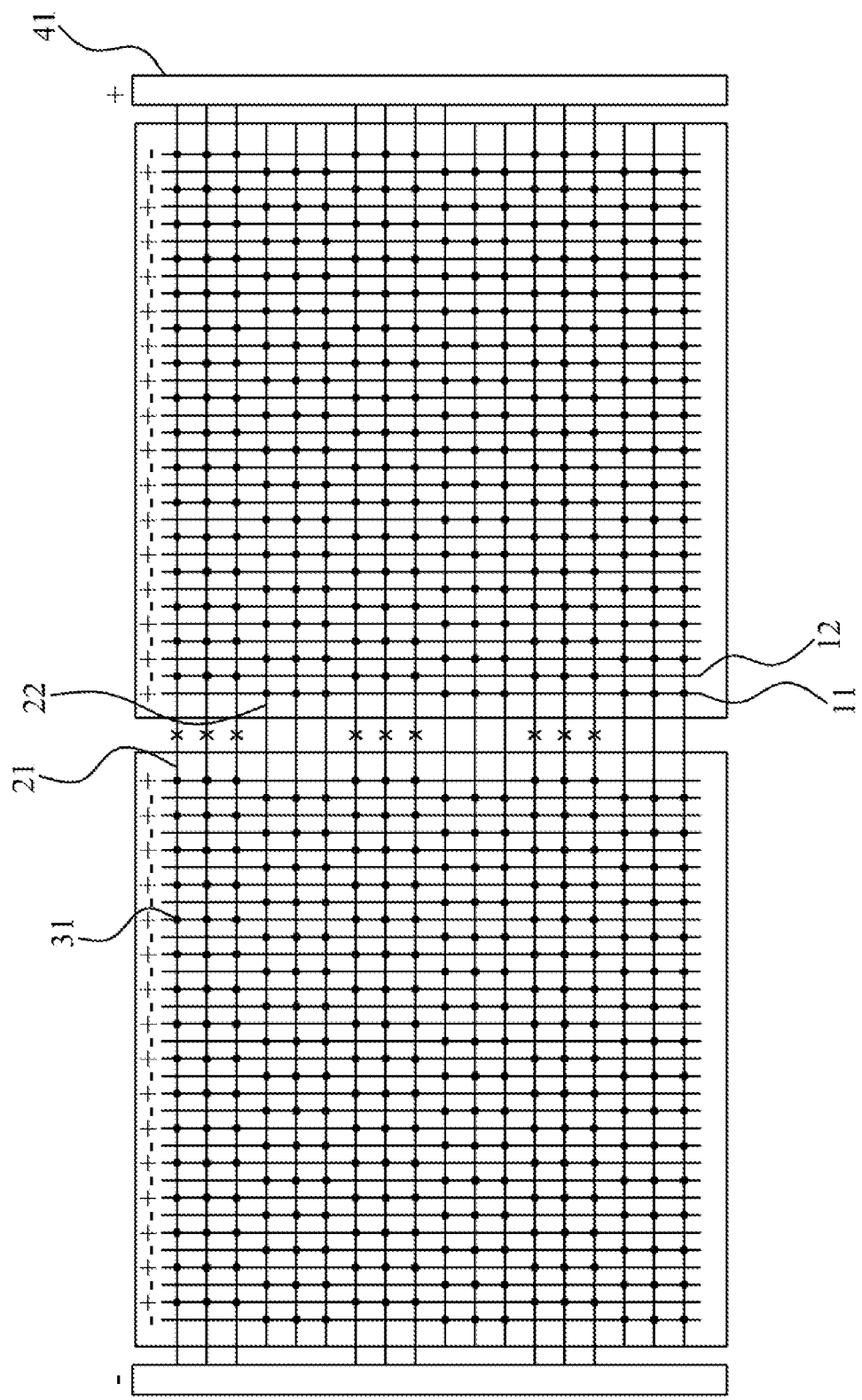
FIG. 3 is a schematic structural diagram of a back contact solar cell string according to still another embodiment of the disclosure.
Figure 4:
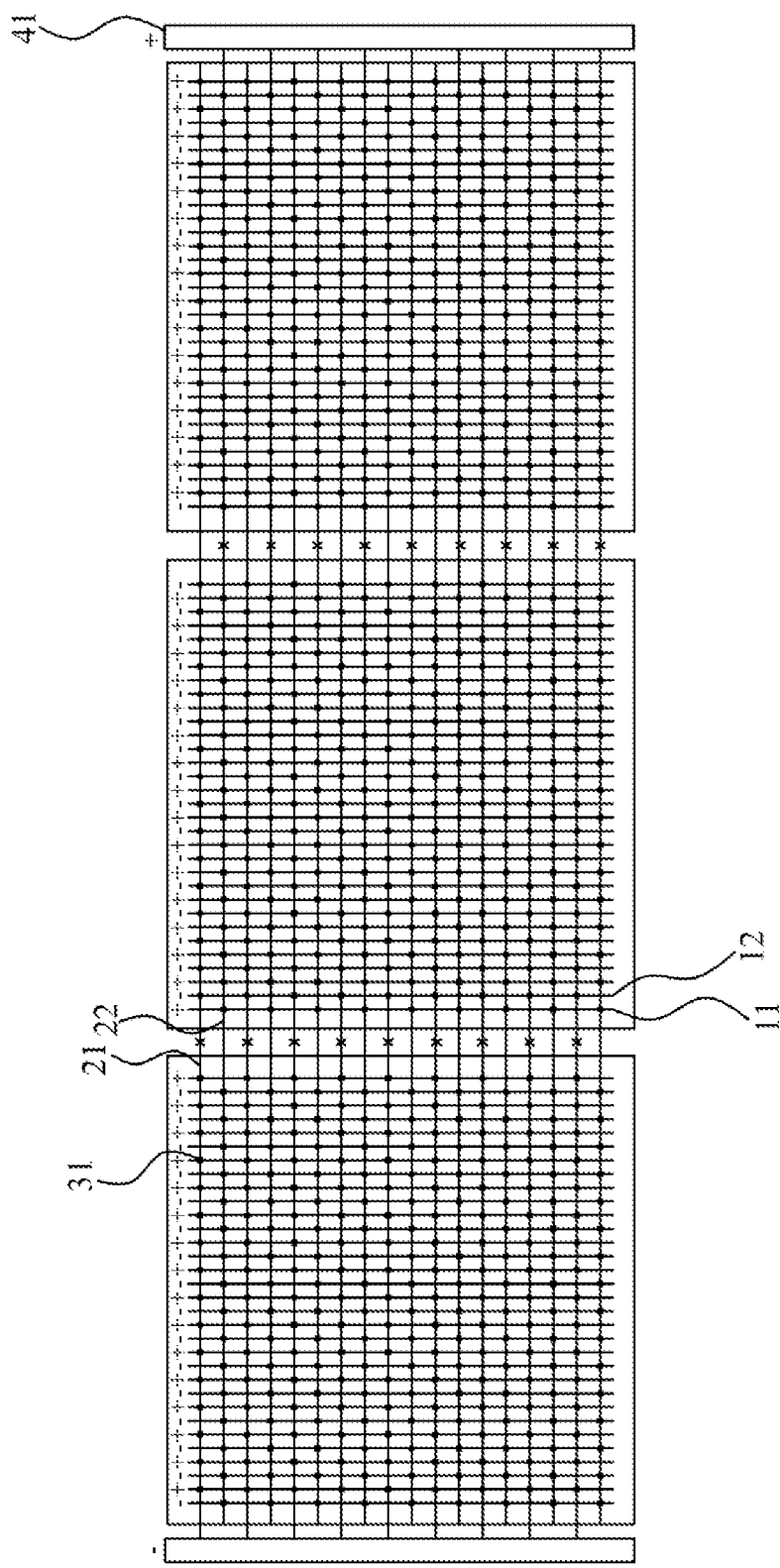
FIG. 4 is a schematic structural diagram of a back contact solar cell string according to yet another embodiment of the disclosure.

In an embodiment of the disclosure, the back contact solar cell string is a cell string formed by serially connecting at least two cell pieces (that is, back contact solar cells) by using the conductive wires. The cell string may comprise two cell pieces, three cell pieces, or other quantities of cell pieces that are serially connected to each other. FIG. 1 to FIG. 3 show a cell string formed by two cell pieces serially connected to each other. FIG. 4 shows a cell string formed by three cell pieces serially connected to each other according to other embodiments of the disclosure. It may be understood that, the cell string may also comprise other quantities of cell pieces serially connected to each other according to actual use requirements, which is not shown in the figure. The cell string is designed according to actual requirements. The cell pieces at two end portions of the cell string are defined as end cell pieces. When the cell string comprises a plurality of cell pieces serially connected to each other, the cell pieces serially connected between the two end cell pieces are defined as internal cell pieces.

In an example of the disclosure, the cell pieces each comprise a front passivation and anti-reflection layer, a silicon substrate, a back tunneling layer, N-type doped regions and P-type doped regions alternately disposed, a back passivation layer, and a cell electrode from top to bottom. The N-type doped region and the P-type doped region are alternately disposed on a lower surface of the back tunneling layer. The cell electrode comprises positive electrode thin grid lines 11 and negative electrode thin grid lines 12. The positive electrode thin grid lines 11 come into contact with the P-type doped region, and the negative electrode thin grid lines 12 come into contact with the N-type doped region. It may be understood that, in other embodiments of the disclosure, a structure of the cell piece may also be designed differently, which is not limited herein. It is to be noted that, in a cell piece of any structural type, the positive electrode thin grid lines 11 are disposed in the P-type doped region, and the negative electrode thin grid lines 12 are disposed in the N-type doped region.

Further, FIG. 1 is a back view of two adjacent cell pieces to be serially connected according to an embodiment of the disclosure. The cell pieces each comprise the positive electrode thin grid lines 11 alternately disposed in the P-type doped region and the negative electrode thin grid lines 12 alternately disposed in the N-type doped region. All of the positive electrode thin grid lines 11 and the negative electrode thin grid line 12 are substantially parallel to an edge of the cell piece and are alternately disposed. The cell pieces are substantially in rectangular shapes. The expression "the cell pieces are substantially rectangular cell pieces" means that, for example, the cell pieces may be in square shapes, or may be in another rectangular shape, and may have standard corners, cut corners, or rounded corner. The cell pieces are designed according to actual production requirements, which are not specifically limited herein. Quantities of the positive electrode thin grid lines 11 and the negative electrode thin grid lines 12 are determined according to actual sizes of the cell pieces and widths of the positive electrode thin grid lines 11 and the negative electrode thin grid lines 12 and distances therebetween, which are not specifically limited herein. In addition, it is to be noted that, the two adjacent cell pieces to be serially connected may be disposed symmetrically and oppositely. That is to say, polarities of the thin grid lines disposed in sequence may be designed oppositely. As shown in FIG. 1, a first cell piece on a left side comprises the negative electrode thin grid line 12 and the positive electrode thin grid line 11 arranged in sequence from left to right, and an adjacent second cell piece comprises the positive electrode thin grid line 11 and the negative electrode thin grid line 12 arranged in sequence from left to right.

Further, the positive electrode thin grid lines 11 or the negative electrode thin grid lines 12 are aluminum grid lines, silver grid lines, copper grid lines, or silver-coated copper grid lines. It may be understood that, in this embodiment of the disclosure, the positive electrode thin grid lines 11 and the negative electrode thin grid lines 12 may be selected as a same metal type or different metal types. For example, the positive electrode thin grid lines 11 and the negative electrode thin grid lines 12 are both the aluminum grid lines, or the positive electrode thin grid lines 11 are the aluminum grid lines, and the negative electrode thin grid lines 12 are the silver grid lines. When the positive electrode thin grid lines 11 or the negative electrode thin grid lines 12 are the aluminum grid lines or the silver grid lines, the aluminum grid lines or the silver grid lines are printed in the P-type doped region or the N-type doped region by means of silk-screen printing. When the positive electrode thin grid lines 11 or the negative electrode thin grid lines 12 are the copper grid lines, the copper grid lines are plated in the P-type doped region or the N-type doped region by means of electroplating, evaporation, or the like.

Further, in an embodiment of the disclosure, each conductive wire is connected to the positive electrode thin grid lines 11 and the negative electrode thin grid lines 12. According to the above, all of the positive electrode thin grid lines 11 and all of the negative electrode thin grid lines 12 on the cell pieces are parallel to the edges of the cell pieces and are alternately disposed. Thus, it may be determined that, each conductive wire is most preferably perpendicularly connected to the positive electrode thin grid lines 11 and the negative electrode thin grid lines 12. That is to say, each conductive wire is substantially perpendicular to and intersects with the positive electrode thin grid lines 11 and the negative electrode thin grid lines 12. Definitely, it may be understood that, each conductive wire may also not be perpendicular to the positive electrode thin grid lines 11 and the negative electrode thin grid lines 12 Instead, each conductive wire may be deviated from the positive electrode thin grid lines and the negative electrode thin grid lines by a corresponding angle.

Further, in an embodiment of the disclosure, conductive regions and insulation regions are disposed at joints between each conductive wire and the positive electrode thin grid lines 11 and the negative electrode thin grid lines 12. In each conductive region, the conductive wire is electrically connected to the thin grid lines having a same polarity. In each insulation region, the conductive wire is connected to the thin grid lines having another polarity. For example, when the conductive wire is connected to the positive electrode thin grid lines 11 in each conductive region, the conductive wire is connected to the negative electrode thin grid lines 12 in each insulation region. In this case, the conductive wire is electrically connected to the positive electrode thin grid lines 11 on the cell piece and are in insulating connection to the negative electrode thin grid lines 12 on the cell piece. In this way, the conductive wire is prevented from being electrically connected to both the positive electrode thin grid lines 11 and the negative electrode thin grid lines 12. Thus, the conductive wires are used as a positive conductive wire on the cell piece. Correspondingly, the conductive wire is connected to the negative electrode thin grid lines 12 in the conductive regions, and is in insulating connection to the positive electrode thin grid lines 11 in the insulation regions. Refer to the above descriptions, and details are not described herein again.

Electric conductors such as conductive adhesives, solder pastes, or conductive tapes are disposed in the conductive regions. The electric conductors are interlined between the conductive wires and the positive electrode thin grid lines 11 and the negative electrode thin grid lines 12. When the conductive wire is to be connected to the positive electrode thin grid lines 11 and the negative electrode thin grid lines 12 in the conductive regions, the conductive wire is brazed or fused (such as laser welding) to the electric conductors in the conductive regions, and is then electrically connected to the positive electrode thin grid lines 11 and the negative electrode thin grid lines 12 by using the electric conductors, or the conductive wire comes into direct contact with the positive electrode thin grid lines 11 or the negative electrode thin grid lines 12 in the conductive regions to form electrical connection. Correspondingly, insulators 31 are disposed in the insulation regions. The insulators 31 may be non-conductive tapes or insulation films, or may be other proper non-conductive shields or covers. The insulators 31 may comprise materials such as polypropylene or polyethylene, and may further comprise acrylic bonding layers. The insulators 31 are interlined between each conductive wire and the positive electrode thin grid lines 11 and the negative electrode thin grid lines 12. When the conductive wire is to be connected to the positive electrode thin grid lines 11 and the negative electrode thin grid lines 12 in the insulation regions, the conductive wire is insulated from the positive electrode thin grid lines 11 and the negative electrode thin grid lines 12 by using the insulators 31. The electric conductors or the insulators 31 may be in circular shapes, square shapes, triangular shapes, or other shapes. The shapes of the electric conductors or the insulators 31 may be designed according to actual use requirements, provided that the electric conductors or the insulators can realize electrical connection or insulating connection between the conductive wire and the positive electrode thin grid lines 11 and the negative electrode thin grid lines 12, which are not specifically limited herein.

Further, in an embodiment of the disclosure, as shown in FIG. 1, the conductive wires comprise first conductive wires 21 and second conductive wires 22. The first conductive wires 21 are electrically connected to the positive electrode thin grid lines 11 on the cell piece and the negative electrode thin grid lines 12 on the adjacent cell piece in the conductive regions, and are in insulating connection to the negative electrode thin grid lines 12 on the cell piece and the positive electrode thin grid lines 11 on the adjacent cell piece in the insulation regions.

The second conductive wires 22 are electrically connected to the negative electrode thin grid lines 12 on the cell piece and the positive electrode thin grid lines 11 on the adjacent cell piece in the conductive regions, and are in insulating connection to the positive electrode thin grid lines 11 on the cell piece and the negative electrode thin grid lines 12 on the adjacent cell piece in the insulation regions.

It is to be noted that, in order to realize serial connection between the cell pieces, specifically, an electrode of a cell piece that has each polarity is connected to an electrode of the next adjacent cell piece that has another polarity, so as to form mutual connection between the cell pieces. For example, a negative electrode on a back side of the cell piece is connected to a positive electrode on a back side of the next adjacent cell piece. Thus, in this embodiment, during serial connection of the cell pieces by using the conductive wires, when the conductive wires are electrically connected to the positive electrode thin grid lines 11 of one cell piece, the conductive wires are necessarily electrically connected to the negative electrode thin grid lines 12 (having an opposite polarity) of the next adjacent cell piece. In this embodiment, the first conductive wires 21 and the second conductive wires 22 are disposed. The first conductive wires 21 and the second conductive wires 22 are respectively connected to thin grid lines having opposite polarities. As shown in FIG. 1, when the first conductive wires 21 are electrically connected to the positive electrode thin grid lines 11 of the cell piece (the cell piece on a right side) and the negative electrode thin grid lines 12 on the adjacent cell piece (the cell piece on a left side), the second conductive wires 22 are electrically connected to the negative electrode thin grid lines 12 of the cell piece and the positive electrode thin grid lines 11 on the adjacent cell piece. It may be understood that, when there are 3 cell pieces, the first conductive wires 21 are electrically connected to the positive electrode thin grid lines 11 of the cell piece at one end, the negative electrode thin grid lines 12 on the adjacent internal cell piece, and the positive electrode thin grid lines 11 of the cell piece at another end. In this case, the first conductive wires 21 are used positive conductive wires in the cell piece at the one end and as negative conductive wires in the adjacent internal cell piece, thereby forming the serial connection between the cell pieces. In this way, a current may flow from one cell piece to the next adjacent cell piece by using the conductive wires, and is finally exported.

Further, in an embodiment of the disclosure, cross sections of the conductive wires may be in circular shapes, flat shapes (such as a banded shape), slightly flat shapes, or other shapes. The circular conductive wires are preferably selected. It is to be noted that, before and after the cell pieces are serially connected by using the conductive wires, the conductive wires may be pressed by other devices into the flat shapes.

Further, in an embodiment of the disclosure, the conductive wires comprise metal wires and composite films wrapped around part of the metal wires. The metal wires comprise a conductive material (such as copper or aluminum, or other proper conductive materials having or not having coatings such as tin, silver, and nickel, or having an organic solderability preservative). In this embodiment, the metal wires are preferably tin-coated copper wires. The composite films cover ends of the metal wires that are away from the positive electrode thin grid lines 11 and the negative electrode thin grid lines 12, and are a POE film, an EVA film, and a PVB film or the POE/EVA co-extruded film. In this case, in order to serially connect the cell pieces by using the conductive wires to form a cell string, the composite films on the conductive wires may be attached to the cell pieces for pre-bonding by means of low temperature heating. Further, during lamination of the cell string and devices such as glass and a back panel into a module, heating is performed at a low lamination temperature. The tin-coated copper wires may form tin-silver alloy connection with the positive electrode thin grid lines 11 and the negative electrode thin grid lines 12 that are specifically the silver grid lines. In addition, after the lamination, the cured composite films can tighten the fixed connection between the conductive wires and the positive electrode thin grid lines 11 and the negative electrode thin grid lines 12 on the cell pieces, so that warping of cell pieces caused by stress as a result of single-side welding of the back contact cell can be resolved. In other embodiments of the disclosure, the conductive wires may also be metal wires. The conductive wires are fixedly welded to the positive electrode thin grid lines 11 and the negative electrode thin grid lines 12 by means of any of hot melt welding, laser welding, infrared welding, and electromagnetic welding.

Aluminum grid lines are required to be used as the positive electrode thin grid lines 11 in the P-type doped region. When the conductive wires are copper wires or copper wires partially wrapped by the composite films, since aluminum cannot be well welded to copper, the conductive wires cannot be well welded to the positive electrode thin grid lines 11. Therefore, in a preferred embodiment of the disclosure, the positive electrode thin grid lines 11 comprise aluminum grid lines and silver grid lines alternately disposed with each other. The silver grid lines are connected to the conductive regions. That is to say, during silk-screen printing of the positive electrode thin grid lines 11 on the cell piece, the aluminum grid lines and the silver grid lines are alternately printed section by section. The silver grid lines are printed in the conductive regions where the positive electrode thin grid lines 11 are required to be electrically connected to the conductive wires, and the aluminum grid lines are printed at other positions where the positive electrode thin grid lines are not connected to the conductive wires. Since the silver grid lines can be well welded to the conductive wires, the difficulty in welding the positive electrode thin grid lines 11 to the conductive wires as a result of complete use of the aluminum grid line is avoided.

Further, in an embodiment of the disclosure, at least one first conductive wire 21 and a corresponding equal quantity of second conductive wires 22 are alternately disposed. In a preferred embodiment of the disclosure, a first conductive wire 21 and a second conductive wire 22 are alternately disposed, or two first conductive wires 21 and two second conductive wires 22 are alternately disposed. It may be understood that, in other embodiments of the disclosure, other quantities (such as three) of first conductive wires 21 and a corresponding quantity (such as three) of second conductive wires 22 may be alternately disposed. The first conductive wires and the second conductive wires are arranged according to a quantity and an arrangement that are actually required, which are not specifically limited herein. Referring to FIG. 1, a first conductive wire 21 and a second conductive wire 22 are alternately disposed. Referring to FIG. 2, two first conductive wires 21 and two second conductive wires 22 are alternately disposed. Referring to FIG. 3, three first conductive wires 21 and three second conductive wires 22 are alternately disposed.

Further, in an embodiment of the disclosure, as shown in FIG. 1, the positive electrode thin grid lines 11 (having a positive electrode) of the cell piece (the cell piece on a right side) are connected to the negative electrode thin grid lines 12 (having a negative electrode) of the adjacent cell piece (the cell piece on a left side) by using the first conductive wires 21, and the negative electrode thin grid lines 12 of the cell piece are connected to the positive electrode thin grid lines 11 of the adjacent cell piece by using the second conductive wires 22. Therefore, if the first conductive wires 21 and the second conductive wires 22 are not cut off, a short circuit occurs between the two cell pieces. Thus, one of the first conductive wires 21 and the second conductive wires 22 between two cell pieces is required to be cut off, so that the independent positive electrode and negative electrode can be recovered. Therefore, the sequential serial connection between the cell pieces is realized, that is, the negative electrode of each cell piece is connected to the positive electrode of the adjacent cell piece so as to achieve the serial connection. In addition, a current in each cell piece flows from the negative electrode to the positive electrode. Thus, in an embodiment of the disclosure, a same quantity of conductive wires is cut off between the two adjacent cell pieces at an interval of a first preset quantity of conductive wires. The first preset quantity is in a range of 1-4.

Preferably, the interval of the first preset quantity for the conductive wires is required to correspond to a quantity by which a plurality of first conductive wires 21 and a plurality of second conductive wires 22 are alternately disposed. As shown in FIG. 1, when a first conductive wire 21 and a second conductive wire 22 are alternately disposed, one conductive wire is correspondingly cut off at an interval of one conductive wire. As shown in FIG. 2, when two first conductive wires 21 and two second conductive wires 22 are alternately disposed, two conductive wires are correspondingly cut off at an interval of two conductive wires. As shown in FIG. 3, when three first conductive wires 21 and three second conductive wires 22 are alternately disposed, two conductive wires are correspondingly cut off at an interval of three conductive wires. Preferably, the plurality of conductive wires cut off at intervals between the two cell pieces are conductive wires of a same type. As shown in FIG. 1 to FIG. 3, the first conductive wires 21 are cut off.

In addition, as shown in FIG. 1, since the cell string comprises two cell pieces serially connected, all of the first conductive wires 21 are regularly cut off between the two cell pieces. Thus, a current at the negative electrode thin grid lines 12 of the cell piece on the left side flows from inside of the cell piece on the left side to the adjacent positive electrode thin grid lines 11. The positive electrode thin grid lines 11 are electrically connected to the second conductive wires 22, so that a current at the positive electrode thin grid lines 11 of the cell piece on the left side flows to the negative electrode thin grid lines 12 of the cell piece on the right side by using the second conductive wires 22, and further flows from inside of the cell piece on the right side to the adjacent positive electrode thin grid lines 11. Therefore, the serial connection between the cell pieces is finally formed. When the cell string comprises three or other quantity of the cell pieces serially connected, as shown in FIG. 4, all of the first conductive wires 21 are cut off between the end cell piece on the left side and the internal cell piece in the middle. All of the second conductive wires 22 are cut off between the internal cell piece in the middle and the end cell piece on the right side. Thus, the current flows from the negative electrode thin grid lines 12 of the end cell piece on the left side to the positive electrode thin grid lines 11 of the end cell piece on the left side, the second conductive wires 22, the negative electrode thin grid lines 12 of the internal cell piece, the positive electrode thin grid lines 11 of the internal cell piece, the first conductive wires 21, the negative electrode thin grid lines 12 of the end cell piece on the right side, and the positive electrode thin grid lines 11 of the end cell piece on the right side in sequence. Therefore, a quantity of the conductive wires required to be cut off between the cell pieces is determined according to an actual quantity of the cell pieces serially connected and a flowing direction of a current that is specifically formed after the serial connection. When there are 4 cell pieces, the first conductive wires 21 are cut off between the end cell piece on the left side and the internal cell piece in the middle, the second conductive wires 22 are cut off between the two internal cell pieces in the middle, and all of the first conductive wires 21 are cut off between the internal cell piece in the middle and the end cell piece on the right side. When conductive wires of a type (such as the first conductive wires 21) are cut off between a cell piece and an adjacent cell piece on the left side that is connected thereto, conductive wires of another type (such as the second conductive wires 22) are cut off between the cell piece and an adjacent cell piece on the right side that is connected thereto.

Further, in an embodiment of the disclosure, the cell string further comprises conductive bus bars 41 located on end portions of the solar cell string. A same quantity of conductive wires is electrically connected to the conductive bus bars 41 at an interval of a second preset quantity of conductive wires. The second preset quantity is in a range of 1-4. The second preset quantity corresponds to the first preset quantity. Specifically, the conductive bus bars comprise two conductive bus bars 41 respectively located on two ends of the two end cell pieces and configured to be used as two electrodes of the whole cell string. That is to say, the currents guided in the positive electrode thin grid lines 11 and the negative electrode thin grid lines 12 in the cell pieces are collected to the conductive bus bars 41 by using the conductive wires. As shown in FIG. 1, the conductive bus bar 41 on the left side is used as a negative electrode end, and the conductive bus bar 41 on the right side is used as a positive electrode end. Since the first conductive wires 21 and the second conductive wires 22 are respectively electrically connected to the positive electrode thin grid lines 11 and the negative electrode thin grid lines 12 having opposite polarities, the conductive bus bars 41 are required to be connected to the single positive electrode thin grid lines 11 or the single negative electrode thin grid lines 12 in the end cell pieces. All of the conductive wires of the two end cell pieces of the cell string may be first cut off, and then the conductive wires required to be connected may be regularly electrically connected to the conductive bus bars 41. Alternatively, all of the conductive wires of the end cell pieces may be first connected to the conductive bus bars 41, and then the conductive wires connected to the conductive bus bars 41 are regularly cut off. That is to say, a same quantity of the conductive wires is electrically connected to the conductive bus bars 41 at an interval of the second present quantity of conductive wire. Referring to FIG. 1, when the first conductive wires 21 and the second conductive wires 22 are alternately disposed, and all of the first conductive wires 21 are cut off at an interval, one conductive wire is electrically connected to the conductive bus bars 41 at an interval of one conductive wire. That is to say, all of the first conductive wires 21 in the end cell piece on the left side are electrically connected to the negative conductive bus bar 41 on the left end, and all of the first conductive wires 21 in the end cell piece on the right end are electrically connected to the positive conductive bus bar 41 on the right end. As shown in FIG. 2, when two first conductive wires 21 and two second conductive wires 22 are alternately disposed, and all of the first conductive wires 21 are cut off at an interval, two conductive wires are electrically connected to the conductive bus bars 41 at an interval of two conductive wires. In order to connect all of the conductive wires (the first conductive wires 21 shown in FIG. 1 to FIG. 4) to the negative electrode thin grid lines 12 in one of the end cell pieces to the negative conductive bus bar 41, all of the conductive wires (the first conductive wires 21 shown in FIG. 1 to FIG. 3 and the second conductive wires 22 shown in FIG. 4) connected to the positive electrode thin grid lines 11 in the other end cell piece are connected to the positive conductive bus bar 41. Details are shown in FIG. 1 to FIG. 4.

In this embodiment of the disclosure, no busbar and ribbon are disposed to collect the current of each cell piece. Instead, the positive electrode thin grid line or the negative electrode thin grid line on each cell piece is directly connected to a corresponding negative electrode thin grid line or positive electrode thin grid line on the next adjacent cell piece by using a plurality of continuous conductive wires, and the conductive wires between the two cell pieces are regularly cut off, so as to achieve the serial connection among the cell pieces. In this way, the consumption of silver paste of the busbar is reduced, and the production costs are reduced. In addition, since the conductive wires are all disposed on back sides of all of the cell pieces and are directly connected to the positive electrode thin grid lines or the negative electrode thin grid lines, conventional operations having difficulty in cell alignment such as circuitous connection from a back side of one cell piece to a front side of a next cell piece are avoided. Thus, the problems such as the high costs as a result of large consumption of paste of conventional cell pieces and the difficulty in manufacturing as a result of circuitous connection among front and back sides of the cell pieces are resolved. Since the conductive wires comprise metal wires and composite films wrapped around part of the metal wires, the composite films may be preheated to melt to wrap the metal wires and the positive electrode thin grid lines and the negative electrode thin grid lines. In addition, the positive electrode thin grid lines and the negative electrode thin grid lines form a uniform and tight whole with the metal wires and the composite films by using a low temperature lamination process. Tin-silver alloy connection is further formed between the metal wires that are tin-coated copper wires and the positive electrode thin grid lines and the negative electrode thin grid lines that are silver grid lines, so that the warping of the cell pieces caused by stress can be resolved.

Example 2

Figure 5:
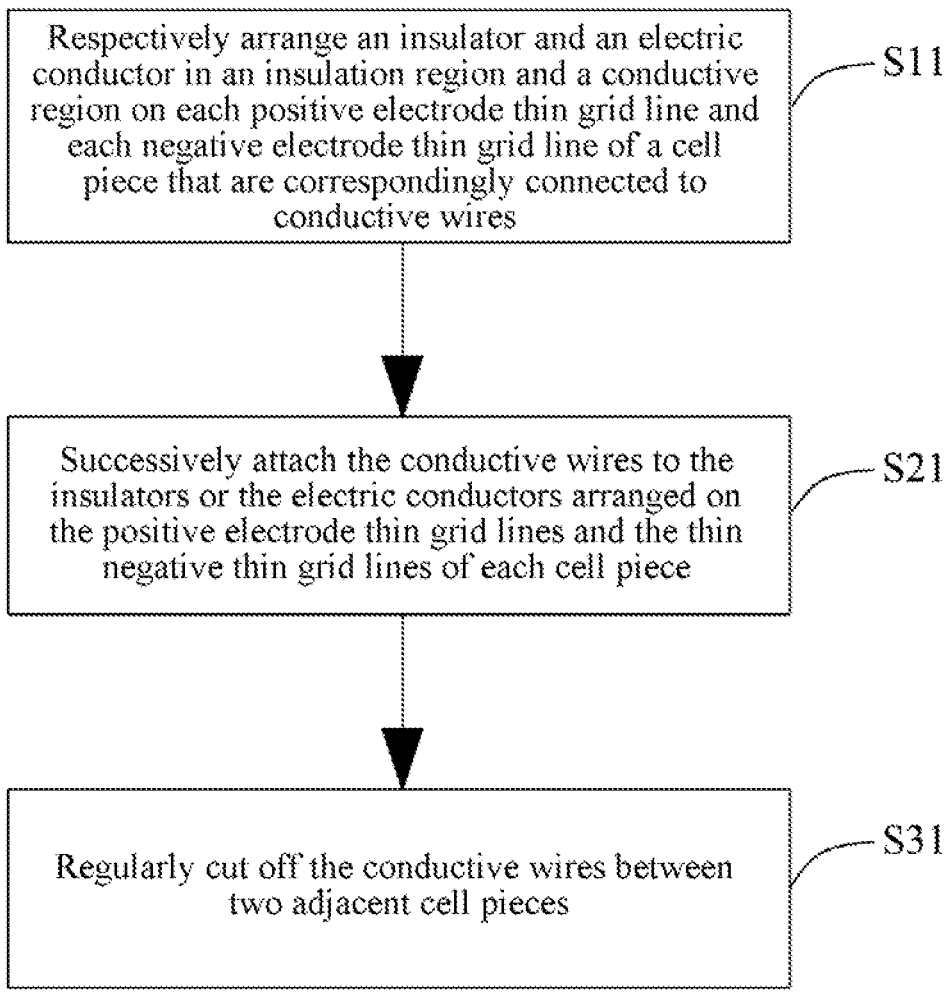
FIG. 5 is a flowchart of a method for preparing a back contact solar cell string according to another embodiment of the disclosure.

FIG. 5 is a flowchart of a method for preparing a back contact solar cell string according to a second embodiment of the disclosure. For ease of description, only parts related to this embodiment of the disclosure are shown. The preparation method is used for preparing the back contact solar cell string described in the above embodiments. Specifically, the comprises the following steps.

S11: Respectively arrange an insulator and an electric conductor in an insulation region and a conductive region on each positive electrode thin grid line and each negative electrode thin grid line of a cell piece that are correspondingly connected to conductive wires.

As shown in FIG. 1 to FIG. 4, the positive electrode thin grid lines and the negative electrode thin grid lines are respectively disposed in the N-type doped regions and the P-type doped regions alternately disposed in the cell piece. For example, as shown in FIG. 1, the negative electrode thin grid lines and the positive electrode thin grid lines are alternately disposed on the end cell piece on the left side from in sequence left to right, and the positive electrode thin grid lines and the negative electrode thin grid lines are alternately disposed on the end cell piece on the right side in sequence from left to right. Each positive electrode thin grid line on the cell piece is required to be electrically connected to one conductive wire, and each negative electrode thin grid line is required to be in insulating connection to the conductive wire, so that the conductive wire is used as a positive conductive wire on the cell piece. Correspondingly, each positive electrode thin grid line on the cell piece is required to be in insulating connection to one conductive wire, and each negative electrode thin grid line is required to be electrically connected to the conductive wire, so that the conductive wire is used as a negative conductive wire on the cell piece. Insulators and electric conductors are alternately disposed in insulation regions and conductive regions at joints between the conductive wires and the positive electrode thin grid lines and the negative electrode thin grid lines in sequence. As shown in FIG. 1, a first conductive wire on a top end is electrically connected to the negative electrode thin grid lines of the end cell piece on the left side, and is in insulating connection to the positive electrode thin grid lines. Thus, at joints on the end cell piece corresponding to the first conductive wire, the conductive region corresponding to each negative electrode thin grid line is coated with an electric conductor, and the insulation region corresponding to each positive electrode thin grid line is coated with an insulator. Other details conform to the above, which are not described herein again. Correspondingly, the electric conductors may comprise conductive materials such as conductive adhesives, solder pastes, or conductive tapes. The insulators may comprise insulating materials such as polypropylene or polyethylene. It may be understood that, since the conductive wire can be electrically connected to the positive electrode thin grid lines or the negative electrode thin grid lines in conductive region, in other embodiments of the disclosure, the electric conductors may not be disposed in the conductive regions. Correspondingly, when the electric conductors are coated, electrical connection and physical connection between the conductive wires and the positive electrode thin grid lines and the negative electrode thin grid lines can be more stable. The insulators are configured to realize the insulating connection between the conductive wires and the positive electrode thin grid lines or the negative electrode thin grid lines in the insulation regions, so that the insulators are prerequisite.

It is to be noted that, preferably, the electric conductors and the insulators are first alternately coated on the positive electrode thin grid lines and the negative electrode thin grid lines. In other embodiments of the disclosure, the electric conductors and the insulators may be alternately coated on the conductive wires. The electric conductors and the insulators are mainly configured to realize electrical connection and insulating connection between the conductive wires and the positive electrode thin grid lines and the negative electrode thin grid lines.

S21: Successively attach the conductive wires to the insulators or the electric conductors arranged on the positive electrode thin grid lines and the negative electrode thin grid lines of each cell piece.

Successively attaching the conductive wires to the insulators or the electric conductors arranged on the positive electrode thin grid lines and the negative electrode thin grid lines of each cell piece specifically comprises:

alternately attaching a third preset quantity of first conductive wires and a third preset quantity of second conductive wires to the insulators or the electric conductors arranged on the positive electrode thin grid lines and the negative electrode thin grid lines of each cell piece.

The first conductive wires are attached to the electric conductors alternately disposed on the positive electrode thin grid lines in the cell piece, the insulators alternately disposed on the negative electrode thin grid lines in the cell piece, the electric conductors alternately disposed on the negative electrode thin grid lines in the adjacent cell piece, and the insulators alternately disposed on the positive electrode thin grid lines in the adjacent cell piece.

The second conductive wires are attached to the electric conductors alternately disposed on the positive electrode thin grid lines in the cell piece, the insulators alternately disposed on the negative electrode thin grid lines in the cell piece, the electric conductors alternately disposed on the negative electrode thin grid lines in the adjacent cell piece, and the insulators alternately disposed on the positive electrode thin grid lines in the adjacent cell piece.

Further, Aluminum grid lines are required to be used as the positive electrode thin grid lines in the P-type doped region. When the conductive wires are copper wires or copper wires partially wrapped by the composite films, since aluminum cannot be well welded to copper, the conductive wires cannot be well welded to the positive electrode thin grid lines. Therefore, in a preferred embodiment of the disclosure, the positive electrode thin grid lines comprise aluminum grid lines and silver grid lines alternately disposed with each other. The silver grid lines are connected to the conductive regions. That is to say, the electric conductors are correspondingly disposed on the silver grid lines disposed on the positive electrode thin grid lines. Since the silver grid lines can be well welded to the conductive wires, the difficulty in welding the positive electrode thin grid lines to the conductive wires as a result of complete use of the aluminum grid line is avoided.

S31: Regularly cut off the conductive wires between two adjacent cell pieces.

The conductive wires between the two adjacent cell pieces are cut off to achieve the serial connection between the cell pieces, so as to collect a current from the cell string. The conductive wires may be cut off by using wire-electrode cutting technologies, such as laser cutting or blade cutting. Specifically, a quantity of conductive wires between the two adjacent cell pieces that are to be cut off is same as a quantity by which the first conductive wires and the second conductive wires are alternately disposed. That is to say, when a third preset quantity of first conductive wires and a third preset quantity of second conductive wires are alternately disposed, a third preset quantity of conductive wires between the two adjacent cell pieces are correspondingly regularly cut off at an interval of a third preset quantity of conductive wires, as shown in the structure in the above embodiments. Specifically, all of the first conductive wires or all of the second conductive wires may be cut off between the two adjacent cell pieces. The step of cutting off the conductive wires between the two adjacent cell pieces is mainly used for realizing flowing of a current of a previous cell piece to a current adjacent cell piece and further flowing from the current cell piece to a next adjacent cell piece during serial connection between the cell pieces, so that the cell pieces are serially connected in sequence to form the cell string. Correspondingly, the conductive wires required to be regularly cut off to enable the current to flow from an initial end of an end portion cell piece to a tail end of another end cell piece may be determined according to the quantity and the arrangement of the cell pieces that are specifically designed, which are not specifically limited herein.

Further, as described in the above embodiments, the conductive wires may comprise metal wires and composite films wrapped around part of the metal wires. After step S21 or step S31, the method further comprises:

pre-bonding the conductive wires to the cell pieces by means of low temperature heating.

During the manufacturing of the cell string, since the conductive wires further comprise the composite films wrapped around part of the metal wires, the composite films may be heated to melt by means of low temperature heating. The melted composite films can wrap the entire conductive wires, the cell pieces, and the electric conductors or the insulators disposed between the conductive wires and the cell pieces, so that the pre-bonding of the conductive wires and the cell pieces is realized. It may be understood that, the step of low temperature heating may be designed after step S21 or step S31, and preferably, designed after step S21. After the conductive wires and the cell pieces are pre-bonded by means of the low temperature heating, the connection between the conductive wires and the cell pieces is more stable. Therefore, a position offset caused by unstable connection between the conductive wires and the cell pieces during subsequent cutting of the conductive wires between the two adjacent cell pieces can be resolved.

Further, in an embodiment of the disclosure, after step S31, the method further comprises:

connecting the conductive wires to the positive electrode thin grid lines and the negative electrode thin grid lines of the cell pieces by means of lamination and heating.

Since different materials such as the stacked cell string, glass, an EVA film/POE film, a back panel, and the like are required to be combined into a whole by using a lamination process during the manufacturing of a cell module, the step of lamination and heating may be performed during the subsequent manufacturing of the module. Definitely, the cell pieces and the conductive wires may also first directly form a uniform and tight whole by means of lamination and heating. During the subsequent manufacturing of the cell module, the cell string may be combined with the glass, the EVA film/POE film, the back panel, and the like into a whole by means of lamination and heating.

Lamination means to combine two or more layers of same or different materials into a whole by means of heating and pressing by using or not using a binding agent. During lamination and heating (where a heating temperature is less than 200° C.), the composite films wrapped around part of the metal wires start to be melted by means of uniform heating, and the conductive wires and the positive electrode thin grid lines or the negative electrode thin grid lines are fused and combined into a uniform and tight whole under a pressure, and at the same time, the metal wires and the positive electrode thin grid lines or the negative electrode thin grid lines form tin-silver alloy connection.

Further, in an embodiment of the disclosure, after step S31, the method further comprises:

regularly electrically connecting the conductive wires on the cell pieces at an end portion to conductive bus bars; or electrically connecting each conductive wire on the cell pieces at the end portion to conductive bus bars; and regularly cutting off the conductive wires between the cell pieces and the conductive bus bars.

After S31, the currents collected on the cell pieces may be converged on the conductive bus bars by using the conductive wires on the end cell pieces in the cell string and the conductive bus bars, so as to form the cell string. It may be understood that, for details of this step, refer to the above, and the details are not described herein again.

According to the method for preparing the back contact solar cell string provided in this embodiment of the disclosure, no busbar and ribbon are disposed to collect the current of each cell piece. Instead, the positive electrode thin grid line or the negative electrode thin grid line on each cell piece is directly connected to a corresponding negative electrode thin grid line or positive electrode thin grid line on a next adjacent cell piece by using a plurality of continuous conductive wires, and the conductive wires between the two cell pieces are regularly cut off, so as to achieve the serial connection among the cell pieces. In this way, the consumption of silver paste of the busbar is reduced, and the production costs are reduced. In addition, since the conductive wires are all disposed on back sides of all of the cell pieces and are directly connected to the positive electrode thin grid lines or the negative electrode thin grid lines, conventional operations having difficulty in cell alignment such as circuitous connection from a back side of one cell piece to a front side of a next cell piece are avoided. Thus, the problems such as the high costs as a result of large consumption of paste of conventional cell pieces and the difficulty in manufacturing as a result of circuitous connection among front and back sides of the cell pieces are resolved.

Example 3

A third embodiment of the disclosure further provides a cell module. The cell module comprises the back contact solar cell string described in the above embodiments.

Specifically, an assembling process of the cell module comprises the following.

Classification of cells: since a production line of solar cell pieces is pretty random, the performance of produced cells is not exactly the same. In order to effectively combine cell pieces having same or similar performance together, the cell pieces are required to be classified according to performance parameters measured by means of a cell test, so as to improve the utilization of the cell pieces, thereby manufacturing a qualified cell module. The cell test is to test values of output parameters (currents and voltages) of the cells.

Serial connection: conductive wires attached to the cell pieces are respectively fixed to positive electrode thin grid lines and negative electrode thin grid lines of the cell pieces, and the conductive wires between two adjacent cell pieces are regularly cut off to form serial connection, thereby forming the cell string described in the above embodiments.

Stacking: after back sides are serially connected and pass quality inspection, glass, a cut EVA film/POE film, the cell string, an EVA film/POE film, glass fiber, and a back panel/glass are stacked in sequence from bottom to top, where relative positions of the cell string and materials such as the glass are guaranteed during the stacking, and a distance between the cell pieces is adjusted.

Lamination of module: the stacked cell pieces are put into a laminator, the module is vacuumized, then EVA is heated to melt so as to bond the cells, the glass, and the back panel together, and finally, the module is cooled and then taken out.

Trimming: during the lamination, the EVA extends outward due to a pressure after being melted and cures, forming rough edges, and therefore the rough edges are required to be cut off after completion of the lamination.

Framing: an aluminum frame is assembled to the module to enhance the strength of the module, so as to further seal the cell module and prolong the service lift of the cell. Gaps between frame and the glass module is filled with silicone resin, and the frames are connected to each other by using key joints.

Bonding of junction box: a box is bonded to a lead on a back side of the module, so as to facilitate connection between the cell and other devices or other cells.

Test of module: an output power of the cell is tested and calibrated, and output characteristics thereof are tested, to determine a quality level of the module.

High voltage test: a specific voltage is applied between the frame of the module and the electrode lead, to test a withstand voltage and insulation strength of the module, thereby ensuring that the module is free of damage in formidable natural conditions (such as a lightning stroke).

According to the cell module provided in this embodiment of the disclosure, no busbar and ribbon are disposed in a cell string to collect a current of each cell piece. Instead, a positive electrode thin grid line or a negative electrode thin grid line on each cell piece is directly connected to a corresponding negative electrode thin grid line or positive electrode thin grid line on a next adjacent cell piece by using a plurality of continuous conductive wires, and the conductive wires between the two cell pieces are regularly cut off, so as to achieve serial connection among the cell pieces. In this way, the consumption of silver paste of the busbar is reduced, and the production costs are reduced. In addition, since the conductive wires are all disposed on back sides of all of the cell pieces and are directly connected to the positive electrode thin grid lines or the negative electrode thin grid lines, conventional operations having difficulty in cell alignment such as circuitous connection from a back side of one cell piece to a front side of a next cell piece are avoided. Thus, the problems such as the high costs as a result of large consumption of paste of conventional cell pieces and the difficulty in manufacturing as a result of circuitous connection among front and back sides of the cell pieces are resolved.

Embodiment 4

A fourth embodiment of the disclosure further provides a photovoltaic system. The photovoltaic system comprises the cell module described in the above embodiments.

According to the photovoltaic system provided in this embodiment of the disclosure, no busbar and ribbon are disposed in a cell string in a cell module to collect a current of each cell piece. Instead, a positive electrode thin grid line or a negative electrode thin grid line on each cell piece is directly connected to a corresponding negative electrode thin grid line or positive electrode thin grid line on a next adjacent cell piece by using a plurality of continuous conductive wires, and the conductive wires between the two cell pieces are regularly cut off, so as to achieve serial connection among the cell pieces. In this way, the consumption of silver paste of the busbar is reduced, and the production costs are reduced. In addition, since the conductive wires are all disposed on back sides of all of the cell pieces and are directly connected to the positive electrode thin grid lines or the negative electrode thin grid lines, conventional operations having difficulty in cell alignment such as circuitous connection from a back side of one cell piece to a front side of a next cell piece are avoided. Thus, the problems such as the high costs as a result of large consumption of paste of conventional cell pieces and the difficulty in manufacturing as a result of circuitous connection among front and back sides of the cell pieces are resolved.

It will be obvious to those skilled in the art that changes and modifications may be made, and therefore, the aim in the appended claims is to cover all such changes and modifications.

What is claimed is:

1. A method for preparing a back contact solar cell string, the method comprising:
   respectively arranging an insulator and an electric conductor in an insulation region and a conductive region on each positive electrode thin grid line and each negative electrode thin grid line of each cell piece that are correspondingly connected to conductive wires;
   successively attaching the conductive wires to insulators or electric conductors arranged on positive electrode thin grid lines and negative electrode thin grid lines of each cell piece; and
   regularly cutting off the conductive wires between two adjacent cell pieces;
   wherein:
   successively attaching the conductive wires to the insulators or the electric conductors arranged on the positive electrode thin grid lines and the negative electrode thin grid lines of each cell piece comprises:
   alternately attaching first conductive wires of a preset number and second conductive wires of the preset number to the insulators or the electric conductors arranged on the positive electrode thin grid lines and the negative electrode thin grid lines of each cell piece;
   the first conductive wires are attached to the electric conductors alternately disposed on the positive electrode thin grid lines in one cell piece, the insulators alternately disposed on the negative electrode thin grid lines in the one cell piece, the electric conductors alternately disposed on the negative electrode thin grid lines in an adjacent cell piece, and the insulators alternately disposed on the positive electrode thin grid lines in the adjacent cell piece; and
   the second conductive wires are attached to the electric conductors alternately disposed on the positive electrode thin grid lines in the one cell piece, the insulators alternately disposed on the negative electrode thin grid lines in the one cell piece, the electric conductors alternately disposed on the negative electrode thin grid lines in other adjacent cell piece, and the insulators alternately disposed on the positive electrode thin grid lines in the other adjacent cell piece.

2. The method of claim 1, wherein the conductive wires comprise metal wires and composite films wrapped around part of the metal wires;
   after successively attaching the conductive wires to the positive electrode thin grid lines and the negative electrode thin grid lines of each cell piece, or after regularly cutting off the conductive wires between the two adjacent cell pieces, the method further comprises:
   pre-bonding the conductive wires to the cell pieces by means of heating.

3. The method of claim 2, wherein the method further comprises:
   connecting the conductive wires to the positive electrode thin grid lines and the negative electrode thin grid lines of each cell piece by means of lamination and heating.

4. The method of claim 1, wherein the positive electrode thin grid lines comprise aluminum grid lines and silver grid lines alternately disposed with each other, and the silver grid lines are connected to the conductive regions.

5. The method of claim 1, wherein the method further comprises:
   regularly electrically connecting the conductive wires on each cell piece at an end portion of the back contact solar cell string to conductive bus bars;
   or
   electrically connecting each conductive wire on each cell piece at the end portion to conductive bus bars; and
   regularly cutting off the conductive wires between each cell piece and the conductive bus bars.

* * * * *